US 9,258,896 B2

United States Patent
Park et al.

(10) Patent No.: US 9,258,896 B2
(45) Date of Patent: Feb. 9, 2016

(54) MULTILAYER CERAMIC CAPACITOR

(71) Applicant: SAMSUNG ELECTRO-MECHANICS CO., LTD., Suwon-Si, Gyeonggi-Do (KR)

(72) Inventors: Min Cheol Park, Suwon-Si (KR); Eun Hyuk Chae, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 122 days.

(21) Appl. No.: 14/257,767

(22) Filed: Apr. 21, 2014

(65) Prior Publication Data

US 2015/0124371 A1 May 7, 2015

(30) Foreign Application Priority Data

Nov. 6, 2013 (KR) .................. 10-2013-0133966

(51) Int. Cl.
*H01G 4/30* (2006.01)
*H05K 1/16* (2006.01)
*H01G 4/012* (2006.01)
*H01G 4/228* (2006.01)
*H01G 4/12* (2006.01)
*H01G 4/005* (2006.01)
*H01G 4/232* (2006.01)

(52) U.S. Cl.
CPC ............ *H05K 1/162* (2013.01); *H01G 4/005* (2013.01); *H01G 4/012* (2013.01); *H01G 4/12* (2013.01); *H01G 4/228* (2013.01); *H01G 4/232* (2013.01); *H01G 4/30* (2013.01)

(58) Field of Classification Search
CPC ......... H01G 4/30; H01G 4/005; H01G 4/012; H01G 4/12; H01G 4/232; H01G 4/228
USPC ............... 361/301.2, 301.4, 303–305, 306.1, 361/306.2, 311–313, 321.1, 321.2
See application file for complete search history.

(56) References Cited

U.S. PATENT DOCUMENTS

| | | | | |
|---|---|---|---|---|
| 6,999,299 B2 * | 2/2006 | Shimizu | ................. | H01G 4/232 257/E21.514 |
| 7,072,169 B2 * | 7/2006 | Hayashi | ................... | H01G 4/30 361/303 |
| 7,403,370 B2 * | 7/2008 | Oi | ......................... | H01G 4/232 257/E23.062 |
| 7,491,283 B2 * | 2/2009 | Karatsu | ................. | H01G 4/012 156/233 |

(Continued)

FOREIGN PATENT DOCUMENTS

JP 2006-157031 A 6/2006
JP 2006-165538 A 6/2006

(Continued)

OTHER PUBLICATIONS

Korean Office Action dated Dec. 12, 2014, issued in corresponding Korean Patent Application No. 10-2013-0133966. (with English translation).

*Primary Examiner* — Nguyen T Ha
(74) *Attorney, Agent, or Firm* — McDermott Will & Emery LLP

(57) ABSTRACT

A multilayer ceramic capacitor may have low equivalent series inductance (ESL), in which via electrodes are opposed to each other diagonally and be off-centered from positions corresponding to center points of external electrodes, so that a distance between the via electrodes is significantly reduced and a current path is reduced.

10 Claims, 6 Drawing Sheets

(56) References Cited

U.S. PATENT DOCUMENTS

| | | | | |
|---|---|---|---|---|
| 7,619,872 B2 * | 11/2009 | Jin | ............ | H01G 9/042 361/301.4 |
| 8,351,180 B1 * | 1/2013 | Ahn | ............ | H01G 4/30 361/303 |
| 8,941,973 B2 * | 1/2015 | Kim | ............ | 29/25.41 |
| 2006/0120018 A1 | 6/2006 | Lee et al. | | |
| 2008/0074826 A1 | 3/2008 | Lee et al. | | |

FOREIGN PATENT DOCUMENTS

| | | |
|---|---|---|
| KR | 10-0843434 B1 | 7/2008 |
| KR | 10-2009-0032767 A | 4/2009 |

* cited by examiner

MULTILAYER CERAMIC CAPACITOR

CROSS-REFERENCE TO RELATED APPLICATION

This application claims the benefit of Korean Patent Application No. 10-2013-0133966 filed on Nov. 6, 2013, with the Korean Intellectual Property Office, the disclosure of which is incorporated herein by reference.

BACKGROUND

The present disclosure relates to a multilayer ceramic capacitor.

A multilayer ceramic capacitor (MLCC), a multilayer chip electronic component, is a chip-type condenser mounted on printed circuit boards of various electronic products including display devices such as liquid crystal displays (LCDs), plasma display panels (PDPs), and the like, computers, personal digital assistants (PDAs), cellular phones, and the like, to charge and discharge electricity.

Multilayer ceramic capacitors (MLCCs) may be used as components of various electronic devices due to advantages thereof such as a small size, high capacitance, ease of mounting, and the like.

Recently, as performance of portable smart devices such as smartphones, tablet personal computers (PCs), or the like, has improved, a driving speed of an application processor (AP) used for calculations has increased.

When the driving speed of the AP is increased as described above, high frequency current should be rapidly supplied to the AP.

The multilayer ceramic capacitor serves to supply current to the AP.

Therefore, in order to rapidly supply high frequency current as described above, a multilayer ceramic capacitor having low equivalent series inductance (ESL) should be used, or a multilayer ceramic capacitor should be embedded in a board to maximally decrease a distance between the multilayer ceramic capacitor and the AP.

However, in the case of using a low ESL multilayer ceramic capacitor, structural problems may occur. Recently, research into a multilayer ceramic capacitor to be embedded in a board has been actively conducted.

SUMMARY

An aspect of the present disclosure may provide a multilayer ceramic capacitor embedded in a board and having low equivalent series inductance (ESL).

According to an aspect of the present disclosure, a multilayer ceramic capacitor may include: a ceramic body in which a plurality of dielectric layers are stacked; a plurality of first and second internal electrodes alternately disposed in the ceramic body with at least one of the dielectric layers interposed therebetween; a pair of first external electrodes disposed on at least one of upper and lower surfaces of the ceramic body to be positioned diagonally with respect to each other; a pair of second external electrodes disposed on at least one of the upper and lower surfaces of the ceramic body to be positioned diagonally with respect to each other in a direction intersecting that of the pair of first external electrodes; a pair of first via electrodes formed to penetrate through the ceramic body in a stacking direction in positions corresponding to those of the pair of first external electrodes, and connecting the plurality of first internal electrodes to each other in the stacking direction; and a pair of second via electrodes formed to penetrate through the ceramic body in the stacking direction in positions corresponding to those of the pair of second external electrodes, and connecting the plurality of second internal electrodes to each other in the stacking direction, wherein the first and second internal electrodes have first and second through holes spaced apart from the second and first via electrodes, respectively, the pair of first via electrodes are opposed to each other diagonally and are disposed to be off-centered from positions corresponding to center points of the pair of first external electrodes, and the pair of second via electrodes are opposed to each other diagonally and are disposed to be off-centered from positions corresponding to center points of the pair of second external electrodes.

According to another aspect of the present disclosure, a multilayer ceramic capacitor may include: a ceramic body in which a plurality of dielectric layers are stacked; a plurality of first and second internal electrodes alternately disposed in the ceramic body with at least one of the dielectric layers interposed therebetween; a pair of first external electrodes disposed on at least one of upper and lower surfaces of the ceramic body to be positioned diagonally with respect to each other and extended to both side surfaces of the ceramic body; a pair of second external electrodes on at least one of the upper and lower surfaces of the ceramic body to be positioned diagonally with respect to each other in a direction intersecting that of the pair of first external electrodes and extended to the side surfaces of the ceramic body; a pair of first via electrodes formed to penetrate through the ceramic body in a stacking direction in positions corresponding to those of the pair of first external electrodes, and connecting the plurality of first internal electrodes to each other in the stacking direction; and a pair of second via electrodes formed to penetrate through the ceramic body in the stacking direction in positions corresponding to those of the pair of second external electrodes, and connecting the plurality of second internal electrodes to each other in the stacking direction, wherein the first internal electrodes have a pair of first through holes spaced apart from the pair of second via electrodes, and a pair of first lead parts exposed to the side surfaces of the ceramic body and connected to portions of the pair of first external electrodes extended to the side surfaces of the ceramic body, the second internal electrodes have a pair of second through holes spaced apart from the pair of first via electrodes, and a pair of second lead parts exposed to the side surfaces of the ceramic body and connected to portions of the pair of second external electrodes extended to the side surfaces of the ceramic body, the pair of first via electrodes are opposed to each other diagonally and are disposed to be off-centered from positions corresponding to center points of the pair of first external electrodes, and the pair of second via electrodes are opposed to each other diagonally and are disposed to be off-centered from positions corresponding to center points of the pair of second external electrodes.

According to another aspect of the present disclosure, a multilayer ceramic capacitor may include: a ceramic body in which a plurality of dielectric layers are stacked; a plurality of first and second internal electrodes alternately disposed in the ceramic body with at least one of the dielectric layers interposed therebetween; a pair of first external electrodes disposed on at least one of upper and lower surfaces of the ceramic body to be positioned diagonally with respect to each other; a pair of second external electrodes disposed on at least one of the upper and lower surfaces of the ceramic body to be positioned diagonally with respect to each other in a direction intersecting that of the pair of first external electrodes; a pair of first via electrodes formed to penetrate through the ceramic body in a stacking direction in positions corresponding to those of the pair of first external electrodes, and connecting the plurality of first internal electrodes to each other in the stacking direction; and a pair of second via electrodes formed to penetrate through the ceramic body in the stacking direction in positions corresponding to those of the pair of second external electrodes, and connecting the plurality of second internal electrodes to each other in the stacking direction, wherein the first and second internal electrodes have first and second through holes spaced apart from the second and first via electrodes, respectively, and when a pitch between the first and second external electrodes is defined as TP, and a pitch between the first and second via electrodes is defined as VP, a ratio VP/TP of the pitch between the via electrodes to the pitch between the external electrodes is in a range of 0.75 to 0.5 ($0.75 \geq VP/TP \geq 0.5$).

According to another aspect of the present disclosure, a multilayer ceramic capacitor may include: a ceramic body in which a plurality of dielectric layers are stacked; a plurality of first and second internal electrodes alternately disposed in the ceramic body with at least one of the dielectric layers interposed therebetween; a pair of first external electrodes disposed on at least one of upper and lower surfaces of the ceramic body to be positioned diagonally with respect to each other and extended to both side surfaces of the ceramic body; a pair of second external electrodes disposed on at least one of the upper and lower surfaces of the ceramic body to be positioned diagonally with respect to each other in a direction intersecting that of the pair of first external electrodes and extended to the side surfaces of the ceramic body; a pair of first via electrodes formed to penetrate through the ceramic body in a stacking direction in positions corresponding to those of the pair of first external electrodes, and connecting the plurality of first internal electrodes to each other in the stacking direction; and a pair of second via electrodes formed to penetrate through the ceramic body in the stacking direction in positions corresponding to those of the pair of second external electrodes, and connecting the plurality of second internal electrodes to each other in the stacking direction, wherein the first internal electrodes have a pair of first through holes spaced apart from the pair of second via electrodes, and a pair of first lead parts exposed to the side surfaces of the ceramic body and connected to portions of the pair of first external electrodes extended to the side surfaces of the ceramic body, the second internal electrodes have a pair of second through holes spaced apart from the pair of first via electrodes, and a pair of second lead parts exposed to the side surfaces of the ceramic body and connected to portions of the pair of second external electrodes extended to the side surfaces of the ceramic body, and when a pitch between the first and second external electrodes is defined as TP, and a pitch between the first and second via electrodes is defined as VP, a ratio VP/TP of the pitch between the via electrodes to the pitch between the external electrodes is in a range of 0.75 to 0.5 ($0.75 \geq VP/TP \geq 0.5$).

The pair of first external electrodes may be disposed to face each other on the upper and lower surfaces of the ceramic body, and the pair of second external electrodes may be disposed to face each other on the upper and lower surfaces of the ceramic body.

The first and second external electrodes have a quadrangular shape, and the first and second via electrodes may be positioned to correspond to corner portions of the first and second external electrodes.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
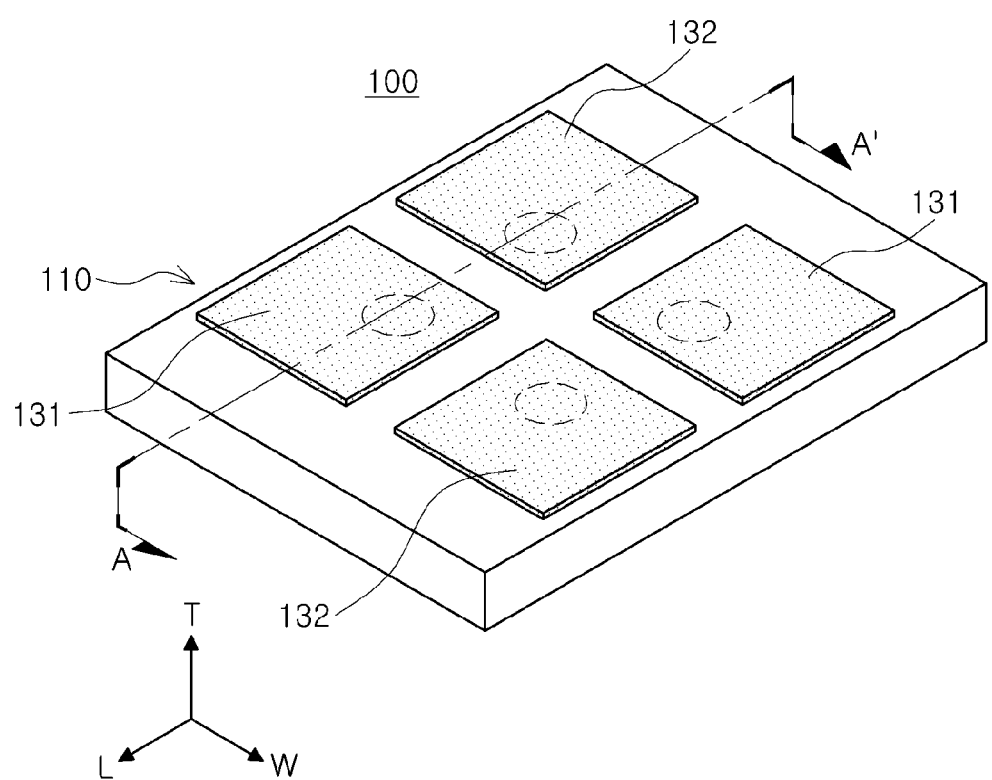
FIG. 1 is a perspective view schematically showing a multilayer ceramic capacitor according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe exemplary embodiments of the present disclosure. L, W and T shown in the accompanying drawings refer to a length direction, a width direction, and a thickness direction, respectively. Here, the thickness direction may be the same as a stacking direction in which dielectric layers are stacked.

In addition, for convenience of explanation, two surfaces of a ceramic body on which first and second external electrodes are formed are referred to as upper and lower surfaces.

Figure 2:
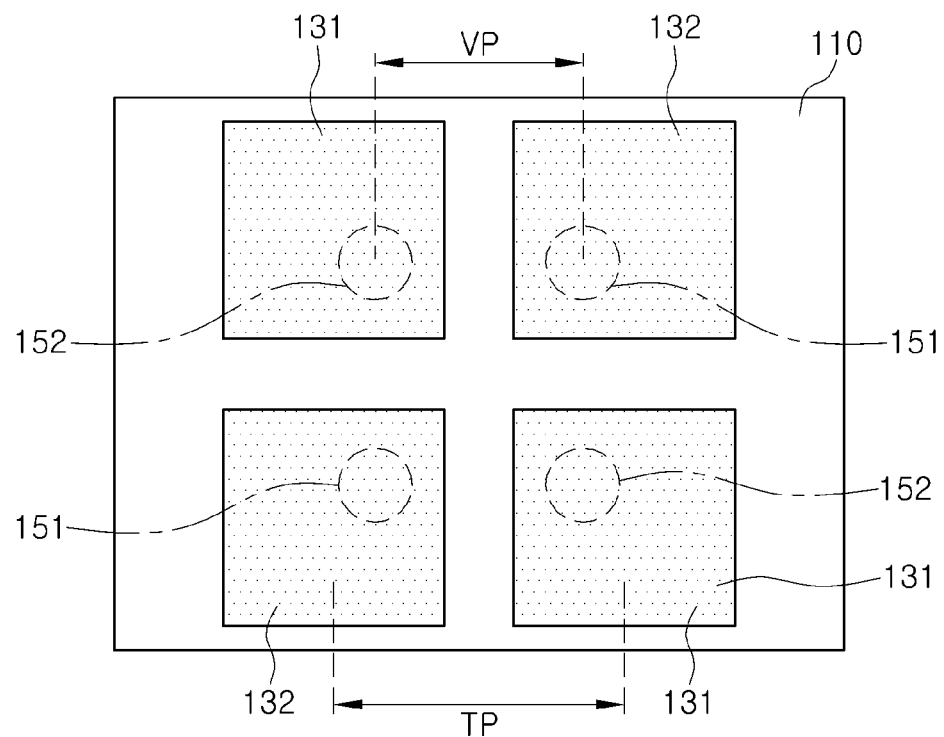
FIG. 2 is a plan view of FIG. 1.
Figure 3:
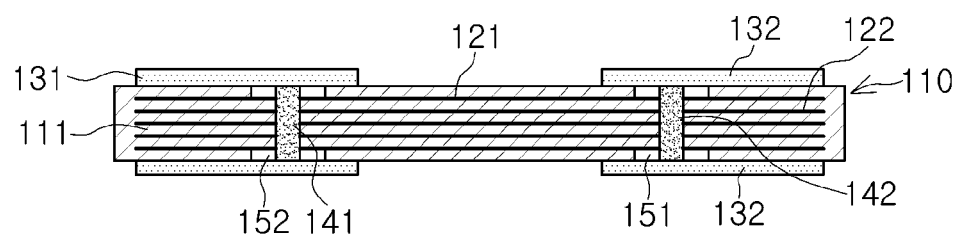
FIG. 3 is a cross-sectional view taken along line A-A' of FIG. 1.

FIG. 1 is a perspective view schematically showing a multilayer ceramic capacitor according to an exemplary embodiment of the present disclosure, FIG. 2 is a plan view of FIG. 1, and FIG. 3 is a cross-sectional view taken along line A-A' of FIG. 1.

Referring to FIGS. 1 through 3, a multilayer ceramic capacitor 100 according to an exemplary embodiment of the present disclosure may include a ceramic body 110, first and second internal electrodes 121 and 122 having second and first through holes 152 and 151, a pair of first external electrodes 131 and a pair of second external electrodes 132, and a pair of first via electrodes 141 and a pair of second via electrodes 142, wherein the pair of first via electrodes 141 and the pair of second via electrodes 142 may be opposed to each other diagonally and be disposed to be off-centered from positions corresponding to center points of the first and second external electrodes 131 and 132 when viewed from above.

The ceramic body 110 may be formed as a hexahedron having first and second main surfaces opposing each other in the thickness direction, first and second end surfaces opposing each other in the length direction, and first and second side surfaces opposing each other in the width direction.

The ceramic body 110 may be formed by stacking a plurality of dielectric layers 111 in the thickness direction and then sintering the stacked dielectric layers.

In this case, a shape and a dimension of the ceramic body 110 and the number of stacked dielectric layers 111 are not limited to those of this exemplary embodiment shown in the accompanying drawings.

In addition, the plurality of dielectric layers 111 configuring the ceramic body 110 may be in a sintered state. Adjacent dielectric layers 111 may be integrated so that boundaries therebetween are not readily apparent without using a scanning electron microscope (SEM).

A thickness of the dielectric layers 111 may be changed according to target capacitance of the multilayer ceramic capacitor 100, and the dielectric layer 111 may contain ceramic powder having high permittivity, for example, barium titanate ($BaTiO_3$) based powder or strontium titanate ($SrTiO_3$) based powder, but the present disclosure is not limited thereto.

Figure 4A:
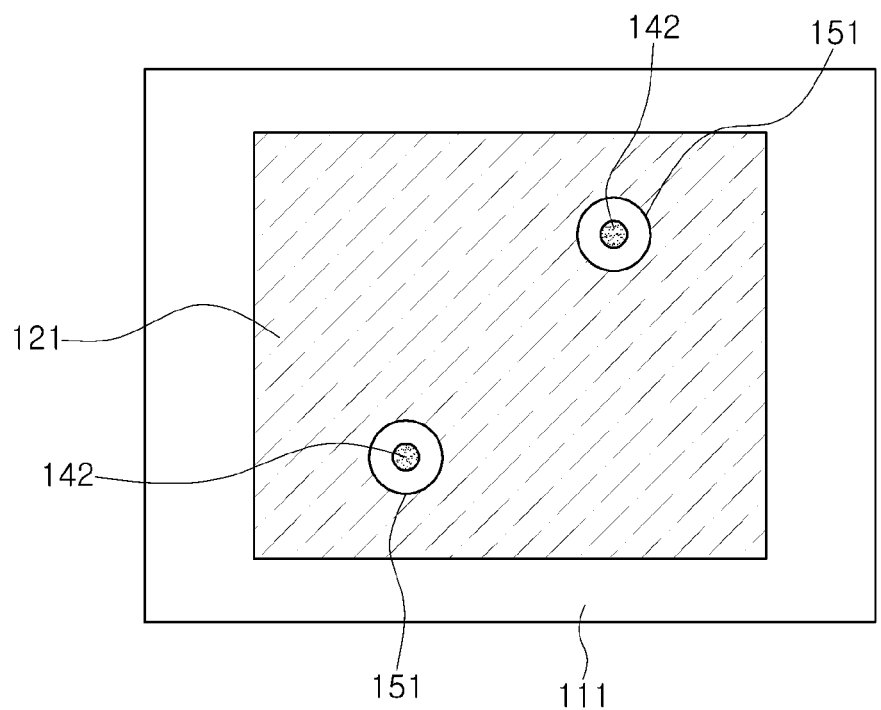
FIG. 4A is a plan view showing a first internal electrode of the multilayer ceramic capacitor according to the exemplary embodiment of the present disclosure.
Figure 4B:
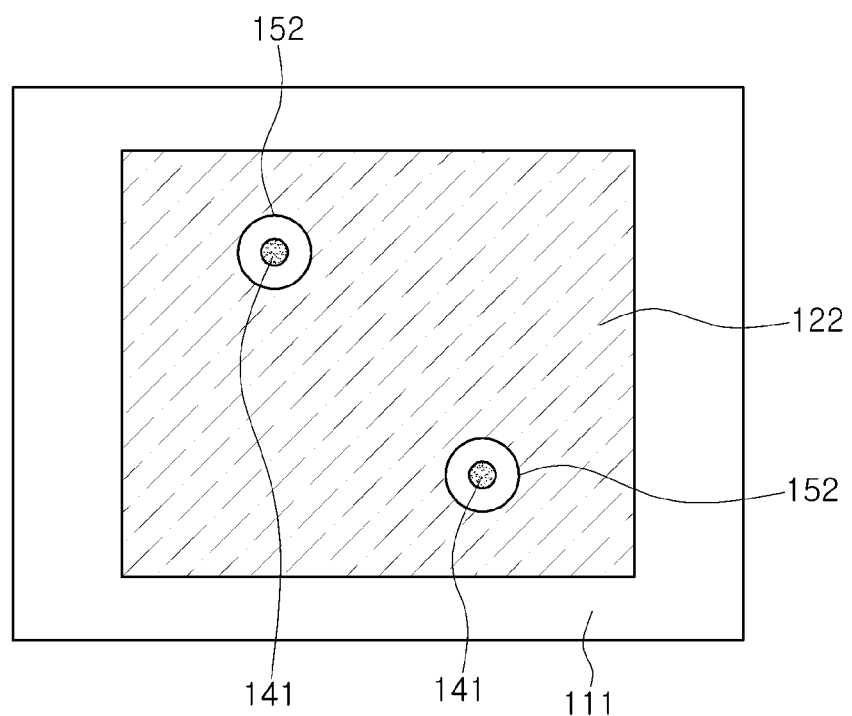
FIG. 4B is a plan view showing a second internal electrode of the multilayer ceramic capacitor according to the exemplary embodiment of the present disclosure.

Referring to FIGS. 4A and 4B, the first and second internal electrodes 121 and 122, a pair of electrodes having different polarities, may be formed by printing a conductive paste containing a conductive metal on the plurality of dielectric layers 111 stacked in the thickness (T) direction at a predetermined thickness. The plurality of first and second internal electrodes 121 and 122 may be alternately disposed in the stacking direction of the dielectric layer 111, with each of the dielectric layers 111 interposed therebetween.

In this case, the first and second through holes 151 and 152 larger than the second and first via electrodes 142 and 141 may be formed in the first and second internal electrodes 121 and 122, respectively. The first and second through holes 151 and 152 may be positioned to correspond to the second and first via electrodes 142 and 141, so that the first and second internal electrodes 121 and 122 are spaced apart from the second and first via electrodes 142 and 141, respectively, to thereby be electrically insulated therefrom.

In this case, the first and second internal electrodes 121 and 122 may be electrically insulated from each other by the dielectric layer 111 disposed therebetween.

The first and second internal electrodes 121 and 122 may be electrically connected to the pair of first external electrodes 131 and the pair of second external electrodes 132 formed on the upper and lower surfaces of the ceramic body 110, respectively, through the first and second via electrodes 141 and 142.

Therefore, when voltage is applied to the first and second external electrodes 131 and 132, electric charges may be accumulated between the first and second internal electrodes 121 and 122 facing each other. In this case, capacitance of the multilayer ceramic capacitor 100 is in proportion to an area of an overlap region between the first and second internal electrodes 121 and 122.

An area of the first and second internal electrodes 121 and 122 may be determined according to intended use, and the present disclosure is not limited by specific numerical values.

Further, the conductive metal contained in the conductive paste forming the first and second internal electrodes 121 and 122 may be nickel (Ni), copper (Cu), palladium (Pd), or an alloy thereof, but the present disclosure is not limited thereto.

In addition, as a method of printing the conductive paste, a screen printing method, a gravure printing method, or the like, may be used, but the present disclosure is not limited thereto.

The pair of first external electrodes 131 may be disposed on at least one of the first and second main surfaces of the ceramic body 110 to be positioned diagonally with respect to each other.

Further, the pair of second external electrodes 132 may be disposed on at least one of the first and second main surfaces of the ceramic body 110 to be positioned diagonally with respect to each other in a direction intersecting that of the pair of first external electrodes 131.

Although a structure in which the pair of first external electrodes 131 and the pair of second external electrodes 132 are symmetrically formed on the upper and lower surfaces of the ceramic body 110 while opposing each other is illustrated in this exemplary embodiment, the present inventive concept is not limited thereto. That is, the first and second external electrodes 131 and 132 may only be formed on one surface of the ceramic body, serving as a mounting surface, if necessary.

Further, although the first and second external electrodes 131 and 132 having a quadrangular shape are illustrated in this exemplary embodiment, the present disclosure is not limited thereto.

The pair of first via electrodes 141 may be formed to penetrate through the ceramic body 110 in the stacking direction in positions corresponding to those of the pair of first external electrodes 131, so as to electrically connect the plurality of first internal electrodes 121 disposed in the stacking direction to the pair of first external electrodes 131 formed on the upper and lower surfaces of the ceramic body 110.

Here, the pair of first via electrodes 141 may be positioned in the second through holes 152 of the second internal electrodes 122, such that the pair of first via electrodes 141 are electrically connected to the first internal electrodes 121 and are insulated from the second internal electrodes 122.

The pair of second via electrodes 142 may be formed to penetrate through the ceramic body 110 in the stacking direction in positions corresponding to those of the pair of second external electrodes 132, so as to electrically connect the plurality of second internal electrodes 122 disposed in the stacking direction to the second external electrodes 132 formed on the upper and lower surfaces of the ceramic body 110.

Here, the pair of second via electrodes 142 may be positioned in the second through holes 151 of the first internal electrodes 121, such that the pair of second via electrodes 142 are electrically connected to the second internal electrodes 122 and are insulated from the first internal electrodes 121.

Further, in the case in which the first and second external electrodes 131 and 132 are formed to have a quadrangular shape, the first and second via electrodes 141 and 142 may be maximally off-centered to be positioned to correspond to adjacent corner portions of the first and second external electrodes 131 and 132.

Meanwhile, when a pitch between the first and second external electrodes 131 and 132 positioned in a linear manner in the length direction is defined as TP, and a pitch between the first and second via electrodes 141 and 142 positioned in a linear manner in the length direction is defined as VP, the following Table 1 shows changes in equivalent series inductance (ESL) according to a ratio VP/TP of the pitch between the via electrodes to the pitch between the external electrodes.

Referring to the following Table 1, it may be seen that in the case in which VP/TP of the multilayer ceramic capacitor is 0.75 or less, low ESL (less than 40 pH) may be implemented.

However, it may be appreciated that in the case in which TP is 0.4 mm and VP is 0.15 mm, VP/TP is 0.375, satisfying a range of 0.75 or less; however, in this case, the pitch between the via electrodes is excessively small, such that the via electrodes are exposed to the external electrodes, resulting in a defect due to high ESL of 40 or greater.

Therefore, VP/TP may be preferably in a range of 0.75 to 0.5 (0.75≥VP/TP≥0.5).

TABLE 1

| Pitch Between External Electrodes (TP) | Pitch Between Via Electrodes (VP) | VP/TP | ESL |
|---|---|---|---|
| 0.4 mm | No Via | | 60 pH |
| 0.4 mm | 0.4 mm | 1.0 | 52 pH |
| 0.4 mm | 0.35 mm | 0.875 | 43 pH |
| 0.4 mm | 0.3 mm | 0.75 | 37 pH |
| 0.4 mm | 0.25 mm | 0.625 | 32 pH |
| 0.4 mm | 0.2 mm | 0.5 | 27 pH |
| 0.4 mm | 0.15 mm | 0.375 | 52 pH |

Therefore, in the case in which the first and second via electrodes 141 and 142 are positioned diagonally with respect to each other while being disposed to be off-centered from the positions corresponding to the center points of the first and second external electrodes 131 and 132, a current path may be reduced, whereby the ESL of the multilayer ceramic capacitor 100 may be reduced.

Figure 5:
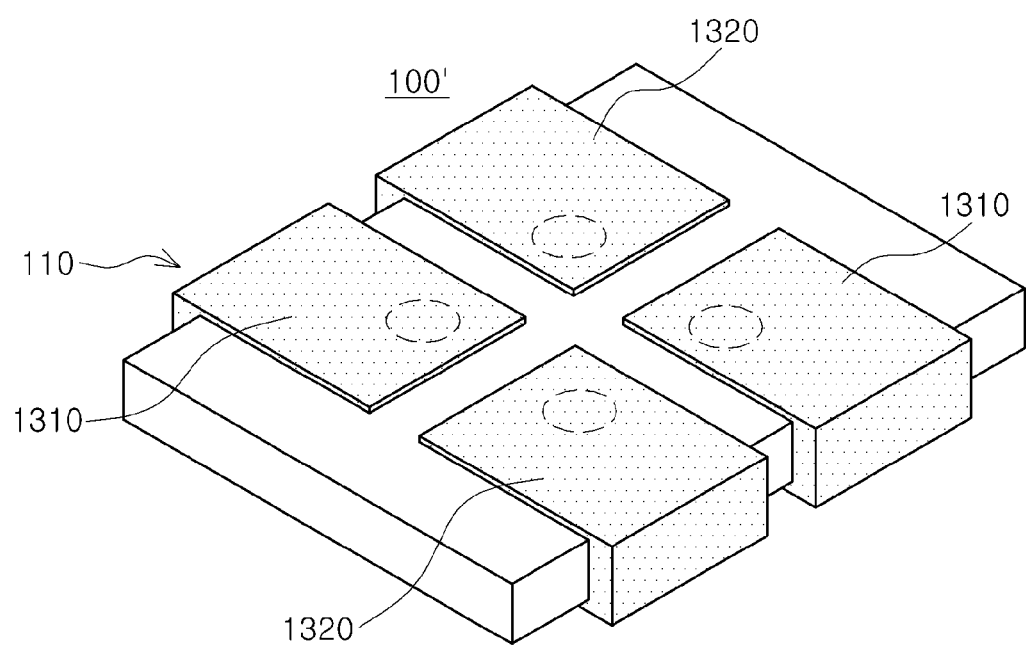
FIG. 5 is a perspective view schematically showing a multilayer ceramic capacitor according to another exemplary embodiment of the present disclosure.
Figure 6:
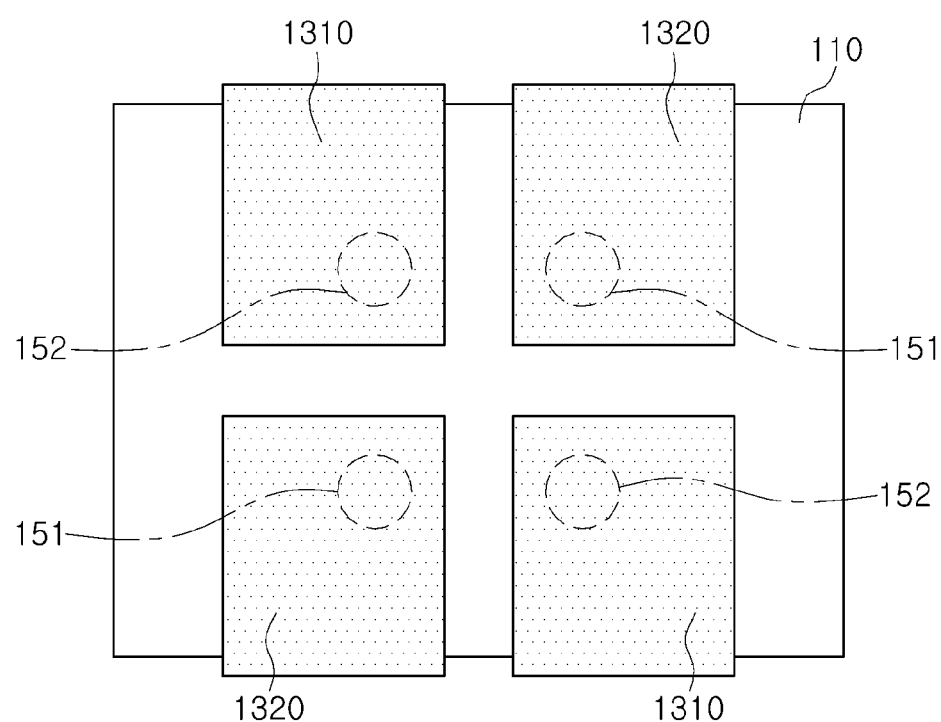
FIG. 6 is a plan view of FIG. 5.

FIG. 5 is a perspective view schematically showing a multilayer ceramic capacitor according to another exemplary embodiment of the present disclosure, and FIG. 6 is a plan view of FIG. 5.

Referring to FIGS. 5 and 6, a multilayer ceramic capacitor 100' according to another exemplary embodiment of the present disclosure may include a ceramic body 110, first and second internal electrodes 121 and 122 having second and first through holes 152 and 151, a pair of first external electrodes 1310 and a pair of second external electrodes 1320, and a pair of first via electrodes 141 and a pair of second via electrodes 142, wherein the pair of first via electrodes 141 and the pair of second via electrodes 142 may be opposed to each other diagonally and be disposed to be off-centered from positions corresponding to center points of the first and second external electrodes 131 and 132 when viewed from above.

In this case, since the configuration of the ceramic body 110, the first and second via electrodes 141 and 142, the first and second through holes 151 and 152 is similar to that described in the above-mentioned exemplary embodiment, a detailed description thereof will be omitted. Here, the first and second internal electrodes 121 and 122 and the first and second external electrodes 1310 and 1320 having structures different from those described in the above-mentioned exemplary embodiment will be described in detail with reference to FIGS. 7A and 7B.

Figure 7A:
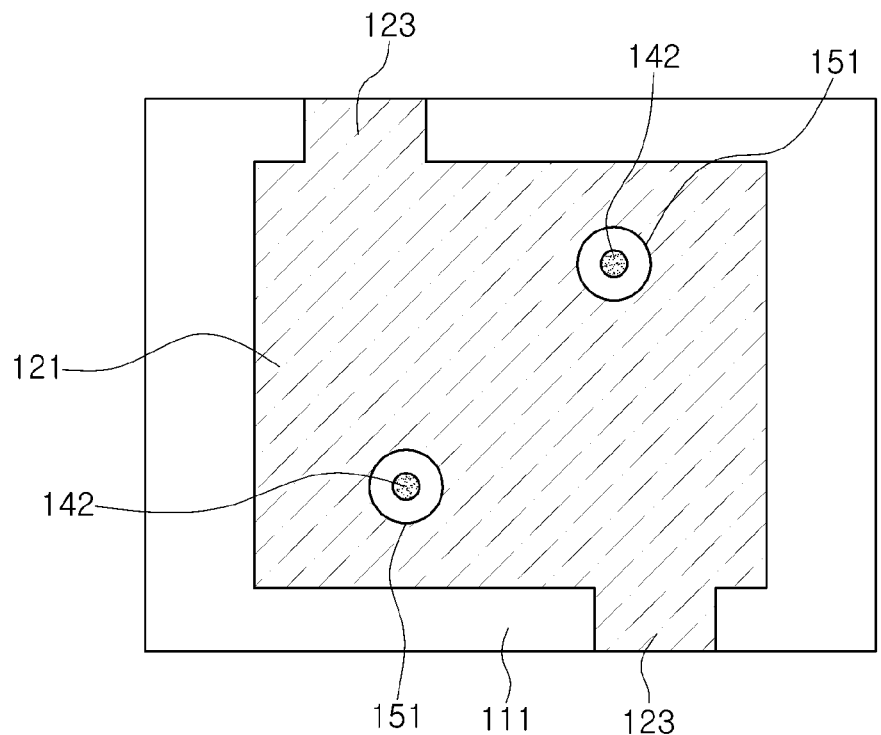
FIG. 7A is a plan view showing a first internal electrode of the multilayer ceramic capacitor according to another exemplary embodiment of the present disclosure.
Figure 7B:
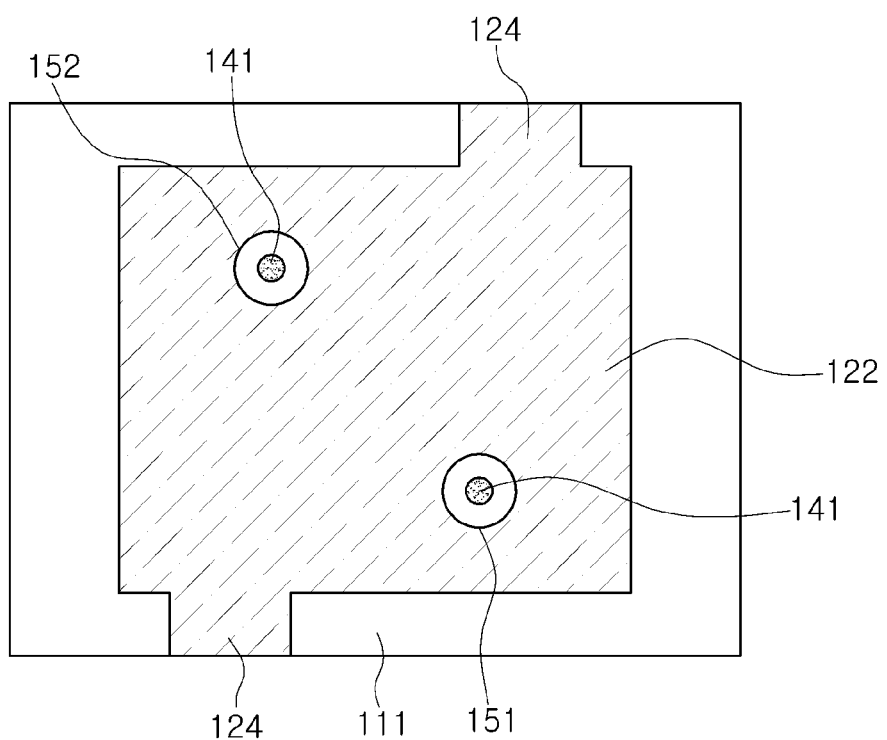
FIG. 7B is a plan view showing a second internal electrode of the multilayer ceramic capacitor according to another exemplary embodiment of the present disclosure.

Referring to FIGS. 7A and 7B, the first and second internal electrodes 121 and 122 may have a pair of first lead parts 123 and a pair of second lead parts 124 exposed to first and second side surfaces of the ceramic body 110 in positions diagonal with respect to each other.

The pair of first external electrodes 1310 may be extended from first and second main surfaces of the ceramic body 110 to the first and second side surfaces thereof.

The first external electrodes 1310 extended to the first and second side surfaces of the ceramic body 110 may be electrically connected to the first lead parts 123 of the first internal electrodes 121, respectively, whereby product reliability may be improved.

The pair of second external electrodes 1320 may be extended from the first and second main surfaces of the ceramic body 110 to the first and second side surfaces thereof.

The second external electrodes 1320 extended to the first and second side surfaces of the ceramic body 110 may be electrically connected to the second lead parts 124 of the second internal electrodes 122, respectively, whereby product reliability may be improved.

Meanwhile, in this exemplary embodiment of the present disclosure, when a pitch between the first and second external electrodes 1310 and 1320 positioned in a linear manner in the length direction is defined as TP, and a pitch between the first and second via electrodes 141 and 142 positioned in a linear manner in the length direction is defined as VP, the following Table 2 shows changes in ESL according to a ratio VP/TP of the pitch between the via electrodes to the pitch between the external electrodes.

Referring to the following Table 2, it may be seen that in the case in which VP/TP of the multilayer ceramic capacitor is 0.75 or less, low ESL (less than 30 pH) may be implemented.

That is, it may be appreciated that in the case in which the first and second internal electrodes 121 and 122 includes the first and second lead parts 123 and 124, respectively, and the first and second external electrodes 1310 and 1320 are extended to the first and second side surfaces of the ceramic body 110, ESL may be further reduced as compared to the above-mentioned exemplary embodiment.

However, it may be appreciated that in the case in which TP is 0.4 mm and VP is 0.15 mm, VP/TP is 0.375, satisfying a range of 0.75 or less; however, in this case, the pitch between the via electrodes is excessively small, such that the via electrodes are exposed to the external electrodes, resulting in a defect due to high ESL of 40 or greater.

Therefore, VP/TP may be preferably in a range of 0.75 to 0.5 (0.75≥VP/TP≥0.5).

TABLE 2

| Pitch Between External Electrodes (TP) | Pitch Between Via Electrodes (VP) | VP/TP | ESL |
|---|---|---|---|
| 0.4 mm | No Via | | 60 pH |
| 0.4 mm | 0.4 mm | 1.0 | 47 pH |
| 0.4 mm | 0.35 mm | 0.875 | 34 pH |
| 0.4 mm | 0.3 mm | 0.75 | 28 pH |
| 0.4 mm | 0.25 mm | 0.625 | 23 pH |
| 0.4 mm | 0.2 mm | 0.5 | 19 pH |
| 0.4 mm | 0.15 mm | 0.375 | 41 pH |

Therefore, in the case in which forming the first and second via electrodes 141 and 142 are positioned diagonally with respect to each other while being disposed to be off-centered from the positions corresponding to the center points of the first and second external electrodes 1310 and 1320, a current path may be reduced, whereby the ESL of the multilayer ceramic capacitor 100 may be reduced.

As set forth above, in a multilayer ceramic capacitor according to exemplary embodiments of the present disclosure, a current path may be reduced by forming via electrodes to be opposed to each other diagonally and be off-centered from positions corresponding to center points of external electrodes, so that a distance between the via electrodes is significantly reduced, whereby low ESL may be implemented.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor, comprising:
a ceramic body in which a plurality of dielectric layers are stacked;
a plurality of first and second internal electrodes alternately disposed in the ceramic body with at least one of the dielectric layers interposed therebetween;
a pair of first external electrodes disposed on at least one of upper and lower surfaces of the ceramic body to be positioned diagonally with respect to each other;
a pair of second external electrodes disposed on at least one of the upper and lower surfaces of the ceramic body to be positioned diagonally with respect to each other in a direction intersecting that of the pair of first external electrodes;
a pair of first via electrodes formed to penetrate through the ceramic body in a stacking direction in positions corresponding to those of the pair of first external electrodes, and connecting the plurality of first internal electrodes to each other in the stacking direction; and
a pair of second via electrodes formed to penetrate through the ceramic body in the stacking direction in positions corresponding to those of the pair of second external electrodes, and connecting the plurality of second internal electrodes to each other in the stacking direction,
wherein the first and second internal electrodes have first and second through holes spaced apart from the second and first via electrodes, respectively,
the pair of first via electrodes are opposed to each other diagonally and are disposed to be off-centered from positions corresponding to center points of the pair of first external electrodes, and
the pair of second via electrodes are opposed to each other diagonally and are disposed to be off-centered from positions corresponding to center points of the pair of second external electrodes.

2. The multilayer ceramic capacitor of claim 1, wherein the pair of first external electrodes are disposed to face each other on the upper and lower surfaces of the ceramic body, and
the pair of second external electrodes are disposed to face each other on the upper and lower surfaces of the ceramic body.

3. The multilayer ceramic capacitor of claim 1, wherein the first and second external electrodes have a quadrangular shape, and
the first and second via electrodes are positioned to correspond to corner portions of the first and second external electrodes.

4. A multilayer ceramic capacitor, comprising:
a ceramic body in which a plurality of dielectric layers are stacked;
a plurality of first and second internal electrodes alternately disposed in the ceramic body with at least one of the dielectric layers interposed therebetween;
a pair of first external electrodes disposed on at least one of upper and lower surfaces of the ceramic body to be positioned diagonally with respect to each other and extended to both side surfaces of the ceramic body;
a pair of second external electrodes on at least one of the upper and lower surfaces of the ceramic body to be positioned diagonally with respect to each other in a direction intersecting that of the pair of first external electrodes and extended to the side surfaces of the ceramic body;
a pair of first via electrodes formed to penetrate through the ceramic body in a stacking direction in positions corresponding to those of the pair of first external electrodes, and connecting the plurality of first internal electrodes to each other in the stacking direction; and
a pair of second via electrodes formed to penetrate through the ceramic body in the stacking direction in positions corresponding to those of the pair of second external electrodes, and connecting the plurality of second internal electrodes to each other in the stacking direction,
wherein the first internal electrodes have a pair of first through holes spaced apart from the pair of second via electrodes, and a pair of first lead parts exposed to the side surfaces of the ceramic body and connected to portions of the pair of first external electrodes extended to the side surfaces of the ceramic body,
the second internal electrodes have a pair of second through holes spaced apart from the pair of first via electrodes, and a pair of second lead parts exposed to the side surfaces of the ceramic body and connected to portions of the pair of second external electrodes extended to the side surfaces of the ceramic body,
the pair of first via electrodes are opposed to each other diagonally and are disposed to be off-centered from positions corresponding to center points of the pair of first external electrodes, and
the pair of second via electrodes are opposed to each other diagonally and are disposed to be off-centered from positions corresponding to center points of the pair of second external electrodes.

5. The multilayer ceramic capacitor of claim 4, wherein the pair of first external electrodes are disposed to face each other on the upper and lower surfaces of the ceramic body, and
the pair of second external electrodes are disposed to face each other on the upper and lower surfaces of the ceramic body.

6. The multilayer ceramic capacitor of claim 4, wherein the first and second external electrodes have a quadrangular shape, and
the first and second via electrodes are positioned to correspond to corner portions of the first and second external electrodes.

7. A multilayer ceramic capacitor, comprising:
a ceramic body in which a plurality of dielectric layers are stacked;
a plurality of first and second internal electrodes alternately disposed in the ceramic body with at least one of the dielectric layers interposed therebetween;
a pair of first external electrodes disposed on at least one of upper and lower surfaces of the ceramic body to be positioned diagonally with respect to each other;
a pair of second external electrodes disposed on at least one of the upper and lower surfaces of the ceramic body to be positioned diagonally with respect to each other in a direction intersecting that of the pair of first external electrodes;
a pair of first via electrodes formed to penetrate through the ceramic body in a stacking direction in positions corresponding to those of the pair of first external electrodes, and connecting the plurality of first internal electrodes to each other in the stacking direction; and
a pair of second via electrodes formed to penetrate through the ceramic body in the stacking direction in positions corresponding to those of the pair of second external electrodes, and connecting the plurality of second internal electrodes to each other in the stacking direction, wherein the first and second internal electrodes have first and second through holes spaced apart from the second and first via electrodes, respectively, and when a pitch between the first and second external electrodes is defined as TP and a pitch between the first and second via electrodes is defined as VP, a ratio VP/TP of the pitch between the via electrodes to the pitch between the external electrodes is in a range of 0.75 to 0.5 (0.75≥VP/TP≥0.5).

8. The multilayer ceramic capacitor of claim 7, wherein the pair of first external electrodes are disposed to face each other on the upper and lower surfaces of the ceramic body, and the pair of second external electrodes are disposed to face each other on the upper and lower surfaces of the ceramic body.

9. A multilayer ceramic capacitor, comprising:

a ceramic body in which a plurality of dielectric layers are stacked;

a plurality of first and second internal electrodes alternately disposed in the ceramic body with at least one of the dielectric layers interposed therebetween;

a pair of first external electrodes disposed on at least one of upper and lower surfaces of the ceramic body to be positioned diagonally with respect to each other and extended to both side surfaces of the ceramic body;

a pair of second external electrodes disposed on at least one of the upper and lower surfaces of the ceramic body to be positioned diagonally with respect to each other in a direction intersecting that of the pair of first external electrodes and extended to the side surfaces of the ceramic body;

a pair of first via electrodes formed to penetrate through the ceramic body in a stacking direction in positions corresponding to those of the pair of first external electrodes, and connecting the plurality of first internal electrodes to each other in the stacking direction; and a pair of second via electrodes formed to penetrate through the ceramic body in the stacking direction in positions corresponding to those of the pair of second external electrodes, and connecting the plurality of second internal electrodes to each other in the stacking direction, wherein the first internal electrodes have a pair of first through holes spaced apart from the pair of second via electrodes, and a pair of first lead parts exposed to the side surfaces of the ceramic body and connected to portions of the pair of first external electrodes extended to the side surfaces of the ceramic body, the second internal electrodes have a pair of second through holes spaced apart from the pair of first via electrodes, and a pair of second lead parts exposed to the side surfaces of the ceramic body and connected to portions of the pair of second external electrodes extended to the side surfaces of the ceramic body, and when a pitch between the first and second external electrodes is defined as TP and a pitch between the first and second via electrodes is defined as VP, a ratio VP/TP of the pitch between the via electrodes to the pitch between the external electrodes is in a range of 0.75 to 0.5 (0.75≥VP/TP≥0.5).

10. The multilayer ceramic capacitor of claim 9, wherein the pair of first external electrodes are disposed to face each other on the upper and lower surfaces of the ceramic body, and the pair of second external electrodes are disposed to face each other on the upper and lower surfaces of the ceramic body.

\* \* \* \* \*